United States Patent
Murakami et al.

[11] 3,949,164
[45] Apr. 6, 1976

[54] TELEVISION SIGNAL DETECTING CIRCUIT

[75] Inventors: Shigetoshi Murakami, Tokyo; Hisao Okada, Yokohama, both of Japan

[73] Assignee: Sony Corporation, Tokyo, Japan

[22] Filed: June 17, 1974

[21] Appl. No.: 480,203

[30] Foreign Application Priority Data
June 20, 1973  Japan.......................... 48-73209[U]

[52] U.S. Cl............................................. 178/7.3 R
[51] Int. Cl.².......................................... H04N 5/44
[58] Field of Search............ 178/7.3 R, 7.3 S, 5.8 R, 178/69.5 TV; 307/231

[56] References Cited
UNITED STATES PATENTS

| | | | |
|---|---|---|---|
| 3,609,221 | 9/1971 | Langer............................ | 178/7.3 R |
| 3,610,817 | 10/1971 | Bridgewater..................... | 178/5.8 R |
| 3,632,864 | 1/1972 | Evans.............................. | 178/5.8 R |
| 3,737,565 | 6/1973 | Ma et al........................... | 178/5.8 R |
| 3,751,588 | 8/1973 | Eckenbrecht et al............. | 178/7.35 |

*Primary Examiner*—George H. Libman
*Assistant Examiner*—Mitchell Saffian
*Attorney, Agent, or Firm*—Lewis H. Eslinger; Alvin Sinderbrand

[57] ABSTRACT

A television signal detecting circuit is disclosed which has a first electric source, a second electric source (ground potential) different from the first electric source, a series circuit inserted between the first and second electric sources and consisting of a resistor and a condenser, a switching element connected in parallel with the condenser and adapted to become conductive and non-conductive in response to a synchronizing signal of the television signal, and a voltage detecting device connected to a junction point between the resistor and the condenser. The series circuit consisting of the resistor and the condenser prevents the voltage detecting device from becoming conductive when the television signal is absent and only noise is supplied, whereby the erroneous operation of responding to the noise as if it were the television signal can be prevented. The presence of the television signal is determined via coincidence, or lack of it, between the horizontal synchronizing signals of the incoming signal and locally generated pulses.

8 Claims, 22 Drawing Figures

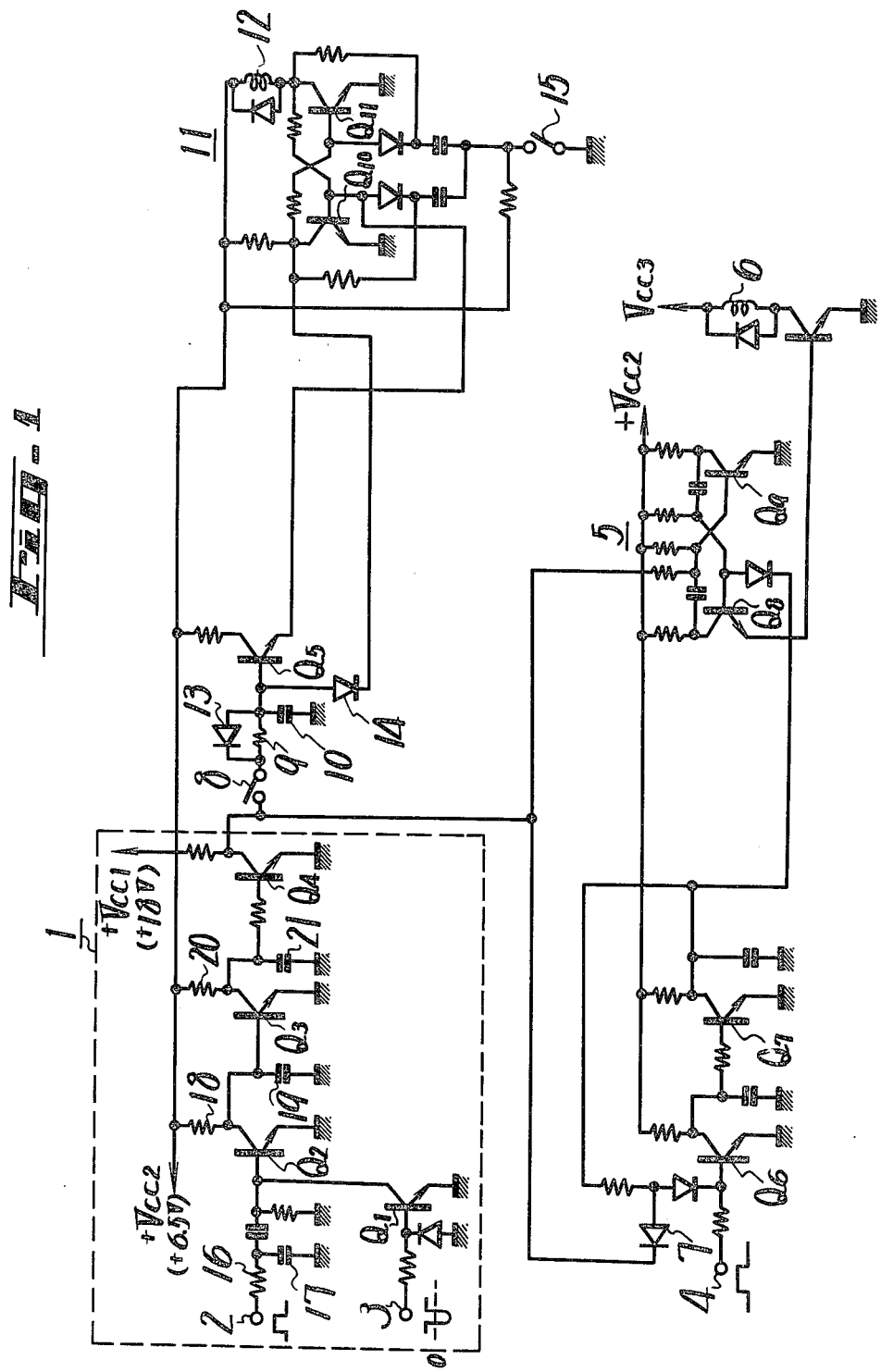

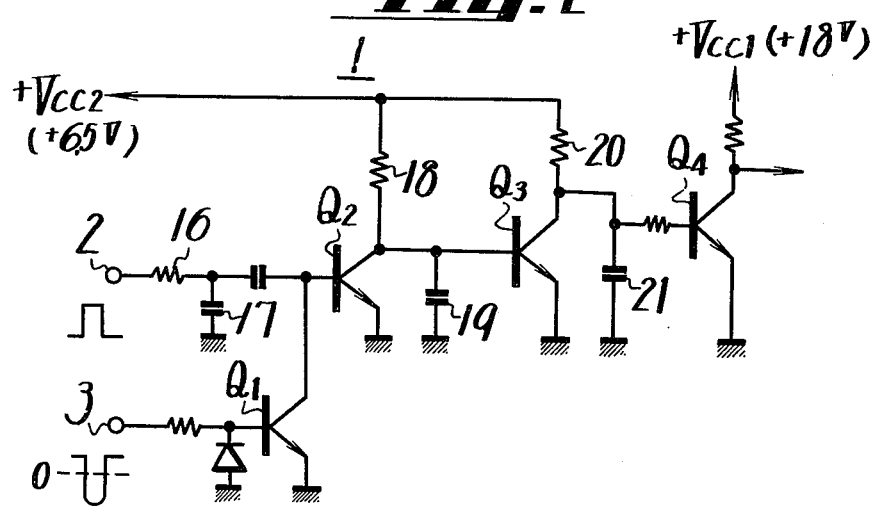
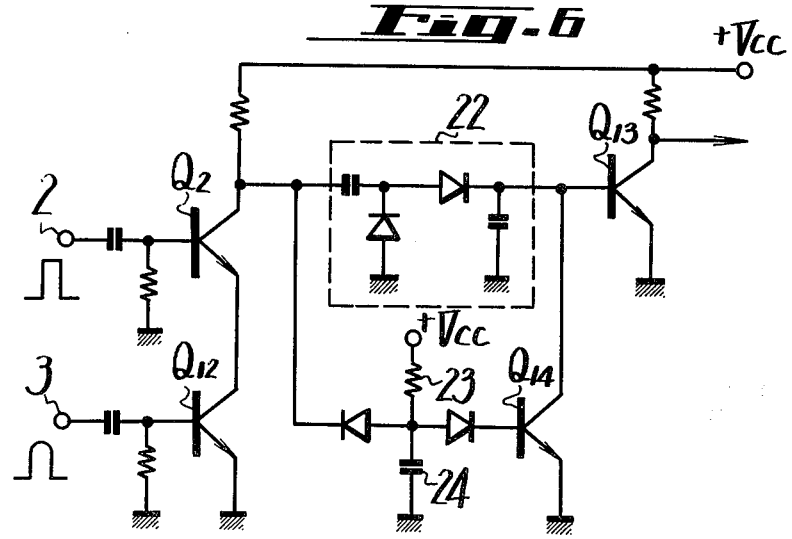

Fig. 3C
Fig. 3D

Fig. 5C
Fig. 5D
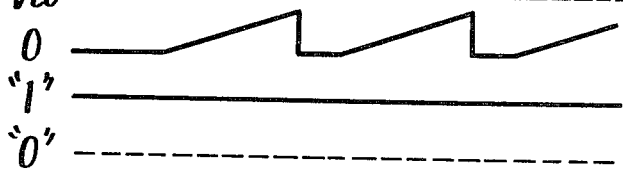

_Fig._7A 
_Fig._7B 
_Fig._7C 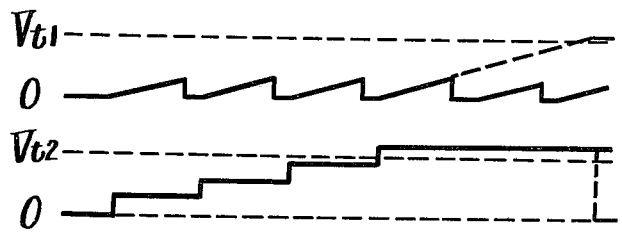
_Fig._7D 
_Fig._8A 
_Fig._8B 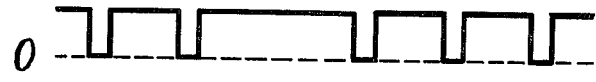
_Fig._8C 
_Fig._9A 
_Fig._9B 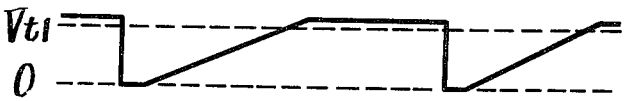

TELEVISION SIGNAL DETECTING CIRCUIT

BACKGROUND OF THE INVENTION

1. Field of the Invention

This invention relates to television signal detecting circuits, and more particularly to a television signal detecting circuit which can prevent an erroneous operation caused by a noise and the like.

2. Description of the Prior Art

Heretofore, it has been the common practice to detect the presence or absence of the television signal for the purpose of controlling a vacant channel skip circuit or a sleep circuit. That is, television receivers capable of being remotely controlled have been arranged to scan through all of the channel frequencies in response to a control signal and to automatically skip each vacant channel on which no signal is being received and to select the next channel on which a signal is present. It has also been known to use means referred to as a sleep switch which is made conductive when a user goes to bed and which can automatically cut off an electric source when the television station goes off the air for the night.

Prior art television signal detecting circuits, which can only detect a video signal, synchronizing signal or the like, have the disadvantage that their signal detecting operation becomes unreliable when the electric signal is weak, such circuits are liable to respond to the noise signal as if it were a television signal.

SUMMARY OF THE INVENTION

An object of the invention is to provide a television signal detecting circuit which can obviate the above-described disadvantage of the prior art television signal detecting circuits and which can reliably detect even a weak television signal and can prevent erroneous response to the noise signal as if it were a television signal.

A feature of the invention is the provision of a television signal detecting circuit comprising a first electric source, a second electric source different from said first electric source, a series circuit inserted between said first and second electric sources and consisting of a resistor and a condenser, a switching element connected in parallel with the condenser and adapted to become conductive and non-conductive in response to a synchronizing signal of said television signal, and a voltage detecting means connected to a junction point between the resistor and said condenser, whereby the output from said voltage detecting means can detect the presence and absence of said television signal.

Other objects, features and advantages of the invention will become apparent from the following description taken in conjunction with the accompanying drawings.

BRIEF DESCRIPTION OF THE DRAWINGS

FIG. 1 is an electric circuit diagram showing one embodiment of the invention;

FIG. 2 is an electric circuit diagram showing essential parts of the embodiment shown in FIG. 1;

FIG. 6 is an electric circuit diagram showing another embodiment of the invention; and FIGS. 7 to 9 are graphs illustrating the operation of the embodiment shown in FIG. 6.

DESCRIPTION OF THE PREFERRED EMBODIMENTS

Figure 3A:
FIGS. 3 to 5 are graphs illustrating the operation of the embodiment shown in FIG. 1.

Some embodiments of the television signal detecting circuit according to the invention will be hereinafter described.

Referring to FIG. 1, a television signal detecting circuit 1, which includes transistors $Q_1$ to $Q_4$, a terminal 2 to which is supplied a positive horizontal synchronizing pulse separated by synchronous operation, and a terminal 3 to which is supplied a negative horizontal pulse generated in a flyback transformer of a television receiver. If the collector of the transistor $Q_4$, which acts as a voltage detecting means, is a ground level (hereinafter designated as 0), the television signal is present. If the collector of the transistor $Q_4$ is at a high level (hereinafter designated as 1), the television signal is absent. The television signal detecting circuit 1 is capable of controlling two modes of operation known as vacant channel skip and sleep switch.

In vacant channel skip, if a channel change-over positive remote control signal is applied to a terminal 4, the base of a transistor $Q_6$ becomes 1 to make the transistor $Q_6$ conductive, or ON and to make the transistor $Q_7$ non-conductive, or OFF. As a result, an astable multivibrator 5 consisting of transistors $Q_8$ and $Q_9$ begins to oscillate. The output from the astable multivibrator 5 causes the coil of a tuner driving solenoid 6 to become periodically conductive. As a result, the tuner is intermittently rotated so as to select any desired broadcasting station. If the channel thus selected is a vacant channel, i.e., a channel on which no signal is being received a diode 7 becomes non-conductive due to the fact that the collector of the transistor $Q_4$ of the television signal detecting circuit 1 is 1. As a result, even when the positive remote control signal is absent, the transistor $Q_6$ is held in its ON condition to cause the oscillation of the astable multivibrator to continue, whereby the successive station selecting operation is continued. If a television signal is present in the channel selected after the remote control signal has become 0, the collector of the transistor $Q_4$ of the television signal detecting circuit 1 becomes 0, and the base of the transistor $Q_6$ becomes 0.

This makes the transistor $Q_6$ non-conductive and makes the transistor $Q_7$ conductive stopping the oscillation of the astable multivibrator 5. As a result, the channel selected is identified as being in a television signal receiving condition. In such channel selecting operation, when the collector of the transistor $Q_4$ is 1, that is, the television signal received channel is of a vacant channel, when the time constant the astable multivibrator 5 is changed to make the oscillation frequency of the multivibrator high. As a result, the time that the tuner remains tuned to the vacant channel is short, thereby reducing the time required to scan through the whole range of channels.

The switch 8 is a sleep switch, which is turned ON when the viewer goes to bed. If the sleep switch 8 is turned ON and the television signal later becomes vacant because the station goes off the air after its broadcasting day has been completed, the collector of the transistor $Q_4$ of the television signal detecting circuit 1 becomes 1 so that the electric source voltage, which has a typical value of +18V from an electric source terminal $+Vcc_1$, is connected by a resistor 9 to a condenser 10 which then gradually charges up. After a given time, for example, several minutes, the voltage across the condenser 10 arrives at a value sufficient to change over the transistor $Q_5$ from non-conductive to conductive. If the transistor $Q_5$ becomes conductive, one of transistors $Q_{10}$ of a flip-flop 11 also becomes conductive, and the other transistor $Q_{11}$ becomes non-conductive. An electric source control relay 12 is connected to the collector of the transistor $Q_{11}$, and as a result, when the transistor $Q_{11}$ becomes non-conductive, the relay 12 also becomes non-conductive, thus turning the electric source of the television receiver OFF.

The above described resistor 9 may be, for example, 10MΩ and the condenser 10 may be 100μF. The time constant of the resistor 9 and condenser 10 is made large so that when a channel is vacant and the collector of the transistor $Q_4$ becomes temporarily 1, the electric source will not be cut off as the tuner scans through that channel frequency. In addition, a diode 13 connected in parallel with the resistor 9 serves to discharge the electric charge of the condenser 10 through the transistor $Q_4$ when the sleep switch 8 is made conductive, thus resulting in a constant elapsed time until the transistor $Q_5$ becomes conductive due to the voltage of the condenser 10. In addition, a diode 14 inserted between the base of the transistor $Q_5$ and the collector of the transistor $Q_{10}$ serves to connect the base of the transistor $Q_5$ to ground and renders the transistor $Q_5$ incapable of preventing the flip-flop 11 from becoming reversed owing to the presence of the noise signal after the electric source of the television receiver has been turned OFF. A manually operated electric source switch 15, for example, a push button switch is connected so that, each time it is pushed, the flip-flop 11 is reversed, either to close or interrupt the electric source, as the case may be.

FIG. 2 shows the television signal detecting circuit 1. The terminal 2, to which is supplied the horizontal synchronizing signal of the television signal detecting circuit 1, is connected through an integrating circuit consisting of a resistor 16 and a condenser 17 to the base of the transistor $Q_2$. The terminal 3, to which is supplied the horizontal pulse generated in a flyback transformer, for example, is connected through a resistor and a clamping diode to the base of the transistor $Q_1$, the emitter of which is grounded and the collector of which is connected to the base of the transistor $Q_2$. The integrating circuit consisting of the resistor 16 and condenser 17 integrates random noise and is so designed that when the television signal is absent, the transistor $Q_2$ is prevented from becoming conductive due to the noise. The transistor $Q_1$ becomes non-conductive and is capable of making the transistor $Q_2$ conductive only when the horizontal pulse is supplied from the terminal 3.

To the collector of the transistor $Q_2$ is connected another integrating circuit consisting of a resistor 18 and a condenser 19. The output from this integrating circuit is supplied to the base of the transistor $Q_3$, and the collector of the transistor $Q_3$ is connected to a third integrating circuit consisting of a resistor 20 and a condenser 21. The output from latter integrating circuit is supplied through a resistor to the base of the transistor $Q_4$ so that the collector voltage of the latter can be used as the detecting output to indicate whether or not the television signal is present, thus controlling the vacant channel skip or the sleep switch.

The operation of the television signal detecting circuit 1 shown in FIG. 2 will now be described with reference to FIGS. 3 to 5.

Figure 3B:
Figure 4A:
Figure 4B:

If a television signal is present and is strong, the terminal 2 is continuously supplied with horizontal synchronizing signals as shown in FIG. 3A, while the terminal 3 is supplied with horizontal pulses (not shown). If the condenser 19 is absent, the voltage produced across the collector of the transistor $Q_2$ becomes a pulse voltage shown by dashed lines in FIG. 3B. The presence of the condenser 19 causes the collector voltage of the transistor $Q_2$ to have a value substantially equal to 0V, as shown by a full line in FIG. 3B. As a result, the transistor $Q_3$ is changed from conductive to non-conductive and held in its non-conductive condition. Thus, the condenser 21 is charged to the electric source voltage of +6.5V present at the electric source terminal +Vcc$_2$. The collector voltage of the transistor $Q_3$ rises at a rate determined by the time constant comprising the resistor 20 and the condenser 21. The voltage at the collector of the transistor 21 is shown in FIG. 3C. If the collector voltage of the transistor $Q_3$ arrives at its threshold value voltage $V_{to}$, the transistor $Q_4$ becomes conductive to make its collector voltage 0 as shown in FIG. 3D, whereby the presence of the television signal is detected.

The detection of a weak television signal will now be described. In the case of a weak electric field, the signal-to-noise ratio of the horizontal synchronizing signal becomes small so that the horizontal synchronizing signal has a level which is not sufficient to make the transistor $Q_2$ conductive. This condition is equivalently shown in FIG. 4A. Since the time constant determined by the resistor 18 and the condenser 19 is selected to be so large that even when several horizontal synchronizing signals whose level is not sufficient to make the transistor $Q_2$ conductive are produced in succession, the collector voltage of the transistor $Q_2$ does not reach to the threshold voltage $V_{to}$. As a result, the circuit can still distinguish between the presence and absence of even a weak television signal.

If the television signal is absent, the terminal 2 does not receive the horizontal synchronizing signal, and the transistor $Q_2$ becomes non-conductive. As a result, the transistor $Q_3$ becomes conductive, and the transistor $Q_4$ becomes non-conductive, thus making its collector 1, thereby detecting the condition that the television signal is absent.

Figure 5A:
Figure 5B:

If the noise signal, which has pulse widths different from each other as shown in FIG. 5A, is supplied to the terminal 2 when the television signal is absent, the narrow noise pulses are removed by the resistor 16 and the condenser 17. If wide noise pulses having an amplitude larger than the peak value of the horizontal synchronizing signal are supplied to the terminal 2, the transistor $Q_2$ becomes conductive. However, it is unusual that wide noise pulses will be continuously supplied to the terminal 2. This noise signal is supplied to the terminal 2 at a rate such that the noise period is substantially 10 to 50 times longer than one horizontal period. As a result, the transistor $Q_2$ does not become continuously conductive, that is, the transistor $Q_2$ becomes conductive once and then becomes non-conductive again, and its collector voltage increases at a rate determined by the time constant consisting of the resistor 18 and the condenser 19. Then, the transistor $Q_3$ is changed from conductive to non-conductive. The collector voltage of the transistor $Q_3$ gradually rises at a rate determined by the time constant comprising the resistor 20 and the condenser 21 as shown in FIG. 5C. The transistor $Q_3$ becomes conductive again at a time when the collector voltage of the transistor $Q_3$ is still below its threshold voltage $V_{to}$. As a result, the transistor $Q_4$ does not become conductive and its collector remains at 1 as shown in FIG. 5D. This prevents the circuit from erroneously confusing the noise shown in FIG. 5A with a television signal.

As stated hereinbefore, the television signal detecting circuit according to the invention is capable of reliably detecting the presence of the television signal even when the signal is weak and is capable of preventing the circuit from erroneously responding to the noise signal as if it were a television signal.

In FIG. 6 is shown another embodiment of the television signal detecting circuit according to the invention. A positive horizontal synchronizing signal is supplied from the terminal 2 to the base of the transistor $Q_2$ whose emitter is connected through the collector-emitter path of a transistor $Q_{12}$ to ground. To the base of the transistor $Q_{12}$ is supplied a positive horizontal pulse from the terminal 3. The collector of the transistor $Q_2$ is connected through a resistor to an electric source +Vcc. Between the collector of the transistor $Q_2$ and the base of a transistor $Q_{13}$ is connected a stepped wave generator circuit 22. Between the electric source terminal +Vcc and ground is a series circuit consisting of a resistor 23 and a condenser 24. A common circuit point between the resistor 23 and the condenser 24 is connected through diodes to the collector of the transistor $Q_2$ and to the base of a transistor $Q_{14}$, respectively. The collector of the transistor $Q_{14}$ is connected to the base of a transistor $Q_{13}$ whose emitter is grounded and collector is connected through a resistor to the electric source terminal +Vcc. The level 1 of the collector of the transistor $Q_{13}$ means the absence of the television signal and the level 0 of the collector of the transistor $Q_{13}$ means the presence of the television signal as in the embodiments of FIGS. 1 and 2.

The embodiment shown in FIG. 6 operates as follows.

A horizontal synchronizing signal shown in FIG. 7A to the terminal 2, while a horizontal pulse in phase with the horizontal synchronizing signal, is supplied to the terminal 3. The collector voltage of the transistor $Q_2$ is shown in FIG. 7B. When the collector voltage of the transistor $Q_2$ is at its high level, the condenser 24 is charged according to a time constant determined by the condenser 24 and resistor 23, and the voltage across the condenser 24 is shown in FIG. 7C. When the horizontal synchronizing signal is continuous, the terminal voltage of the condenser 24 does not reach the threshold voltage $V_{t1}$ at which the transistor $Q_{14}$ becomes conductive. As a result the transistor $Q_{14}$ is held in its non-conductive condition. If the horizontal synchronizing signal is continuously supplied to the stepped wave generator circuit 22, output voltage, of the circuit 22, which is also the base voltage of the transistor $Q_{13}$, gradually increases as shown in FIG. 7D. For example, if four horizontal synchronizing signals are supplied in succession to the stepped wave generator circuit 22, arrives the base voltage of the transistor $Q_{13}$ arrives reaches the threshold voltage $V_{t2}$ to make the transistor $Q_{13}$ conductive, thereby rendering its collector 0. If the television signal is absent, the voltage across the condenser 24 reaches the threshold voltage $V_{t1}$ as shown by dashed lines in FIG. 7C to make the transistor $Q_{14}$ conductive, and as a result, the base potential of the transistor $Q_{13}$ becomes OV as shown by dashed lines in FIG. 7D to make the transistor $Q_{13}$ non-conductive and the collector of the transistor $Q_{13}$ becomes 1. The stepped wave shown in FIG. 7D is a timed signal that controls the operation of the transistor $Q_{13}$ in the same manner that the wawtooth wave in FIG. 3C is a timed signal and controls the operation of the transistor $Q_4$ in FIG. 2.

If the S/N ratio becomes small due to a wak received signal, and as a result the horizontal synchronizing signal has uneven pulse amplitudes, as, shown in FIG. 8A, the transistor $Q_2$ does not become conductive on some occasions as shown in FIG. 8B. Even if the non-conductive condition of the transistor $Q_2$ is continuous for 2H (1H is one horizontal period), the time constant of the resistor 23 and the capacitor 24 is chosen such that the voltage across the condenser 24 charged does not reach the threshold voltage $V_{t1}$ as shown in FIG. 8C. As a result, the transistor $Q_{14}$ remains non-conductive. However, it remains true that if four horizontal synchronizing signals are supplied in succession to the stepped wave generator circuit 22, the base voltage of the transistor $Q_{13}$ reaches the threshold voltage $V_{t2}$ to make the transistor $Q_{13}$ conductive. Thus, even when the electric field is weak, the presence of the television signal can reliably to detected.

If the television signal is absent and a noise having a substantial width is supplied from the terminal 2, the collector voltage of the transistor $Q_2$ is shown FIG. 9A. As a result, the electric charge across the condenser 24 is discharged as shown in FIG. 9B to make the transistor $Q_{14}$ non-conductive. In this case, however, the output from the stepped wave generator circuit 22 does not reach the threshold voltage $V_{t2}$ so that the transistor $Q_{13}$ remains non-conductive, thereby preventing such erroneous operation as to confuse the noise with a television signal.

As seen from the above, the embodiment of the television signal detecting circuit according to the invention shown in FIG. 6 is also capable of reliably detecting the presence of a television signal even when the signal strength is low and preventing the erroneous response to noise as if it were a television signal. Thus the embodiment may of FIG. 6 be applied to the control vacant channel skip or for the sleep switch.

We claim as our invention:
1. A circuit for detecting the presence of a television signal, said circuit comprising:
   A. a coincidence circuit responsive to a horizontal synchronizing pulse signal derived from said television signal and to a locally generated pulse signal;
   B. switching means having one conductivity condition representing the coincidence of said horizontal synchronizing pulse signal and said locally generated pulse signal and a different conductivity condition when said horizontal synchronizing pulse signal is absent; and
   C. connection means connecting said coincidence circuit to said switching means, said connection means comprising:
      1. a first timed-signal generating circuit responsive to a succession of a predetermined number of said horizontal synchronizing signals to cause said switching means to assume said one conductivity condition, and

2. a second timed-signal generating circuit to cause said switching means to assume said different conductivity condition after a predetermined interval in which said horizontal synchronizing signals are absent.

2. The detecting circuit of claim 1 in which said coincidence circuit comprises second switching means connected to receive said horizontal synchronizing signal and a clamping circuit connected to said second switching means to allow said second switching means to respond to signals only during each pulse of said locally generated pulse signal.

3. The detecting circuit of claim 2 in which said second timed-signal generating circuit comprises:
   A. an RC circuit comprising a resistor and a capacitor connected to a source of voltage to charge said capacitor at a predetermined rate, said capacitor being connected to said second switching means to have the voltage across said capacitor returned to a first level each time and for the length of time that said second switching means becomes conductive; and
   B. a second clamping circuit connected to said RC circuit to become conductive when the voltage across said capacitor reaches a second level at the end of said predetermined interval, said second clamping circuit being connected to said first timed-signal generating circuit to control the operation thereof.

4. The detecting circuit of claim 3 in which said first timed-signal generating circuit comprises a second RC circuit comprising a second transistor and a second capacitor connected to a source of voltage to charge said second capacitor at a predetermined rate, said second RC circuit being connected to said first-named switching means to cause said first-named switching means to change from said different conductivity condition to said one conductivity condition when the voltage across said second capacitor charges to a predetermined level, said second clamping circuit being connected to said second capacitor to clamp the voltage thereacross to a certain level when said second clamping circuit is conductive.

5. The detecting circuit of claim 4 in which said first-named switching means is conductive and has an output 0 signal during said one conductivity condition and is non-conductive and has an output 1 signal during said different conductivity condition.

6. The detecting circuit of claim 1 in which said coincidence circuit comprises:
   A. a first transistor connected to be conductive in response to each pulse of said locally generated pulse signal; and
   B. a second transistor connected in series with said first transistor and actuated to be conductive in response to each pulse of proper polarity and sufficient amplitude received by the detecting circuit.

7. The detecting circuit of claim 1 in which said first timed-signal generating circuit comprises a step-generating circuit connected to said coincidence circuit to be actuated by said horizontal synchronizing signals passed therethrough to build up to a predetermined voltage level after a certain number of horizontal synchronizing signal pulses have been applied thereto.

8. The detecting circuit of claim 7 in which said second timed-signal generating circuit comprises:
   A. an RC circuit comprising a resistor and a capacitor connected to a source of direct current to receive charging current therefrom and connected to said coincidence circuit to discharge said capacitor each time said coincidence supplies a signal thereto; and
   B. a third transistor connected to said RC circuit to become conductive when said capacitor charges to a predetermined level, said third transistor being connected to said switching means to cause said switching means to assume said different conductivity condition when said third transistor becomes conductive.

* * * * *